US010162459B2

(12) United States Patent
Teoh et al.

(10) Patent No.: US 10,162,459 B2
(45) Date of Patent: Dec. 25, 2018

(54) APPARATUS AND METHOD FOR EXPANDED TOUCH SENSITIVE ACTUATION OF A USER INTERFACE BUTTON

(71) Applicant: MOTOROLA SOLUTIONS, INC, Chicago, IL (US)

(72) Inventors: Wooi Ping Teoh, Penang (MY); Bing Qin Lim, Jelutong (MY); Murali Kuyimbil, Penang (MY); Wai Mun Lee, Penang (MY); Chan Chee Kit, Penang (MY); Kee Cheah Chan, Penang (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 159 days.

(21) Appl. No.: 15/335,512

(22) Filed: Oct. 27, 2016

(65) Prior Publication Data
US 2018/0121007 A1   May 3, 2018

(51) Int. Cl.
*G06F 3/00* (2006.01)
*G06F 3/041* (2006.01)
(Continued)

(52) U.S. Cl.
CPC ............ *G06F 3/0416* (2013.01); *G06F 3/016* (2013.01); *G06F 3/0219* (2013.01);
(Continued)

(58) Field of Classification Search
CPC ........ G06F 3/0416; G06F 3/165; G06F 3/044; G06F 3/016; G06F 3/04886; G06F 3/0227; G06F 2203/04102
See application file for complete search history.

(56) References Cited

U.S. PATENT DOCUMENTS 4,041,394 A   8/1977   Pate
8,719,724 B2   5/2014   Kawalkar
(Continued)

FOREIGN PATENT DOCUMENTS

JP   2008033701 A   2/2008

OTHER PUBLICATIONS

The International Search Report and the Written Opinion corresponding patent application No. PCT/US2017/057132 filed Oct. 18, 2017, dated Mar. 15, 2018, all pages.

*Primary Examiner* — Muhammad N Edun
(74) *Attorney, Agent, or Firm* — Barbara R. Doutre

(57) ABSTRACT

A user interface apparatus and method are provided for gloved and non-gloved touch sensitive button actuation. A user interface (100) embodied as a body wearable harness (104) provides a touch button control system having an activation button (120) and functional touch sensitive control buttons (108, 110, 140). The activation button (120) has a capacitive touch element (130) associated therewith that determines gloved or non-gloved operation based on a capacitive measurement taken in response to a finger input to the button. A plurality of control buttons (108, 110, and 140) are automatically assigned increased sensitivity levels in response to detected gloved mode operation in accordance with the measurement. The increased sensitivity levels allow various radio functions to be accessed by a gloved finger input during gloved mode operation with increased reliability. Additional control button identification can be added through the addition of vibrational alerts. Display and screen type control buttons can further be combined into larger and fewer buttons for ease of gloved landing.

13 Claims, 15 Drawing Sheets

(51) Int. Cl.
  *G06F 3/01*     (2006.01)
  *G06F 3/02*     (2006.01)
  *G06F 3/044*    (2006.01)
  *G06F 3/0488*   (2013.01)
  *G06F 3/16*     (2006.01)
  *G06F 3/03*     (2006.01)
  *H03K 17/96*    (2006.01)
  *A45F 3/14*     (2006.01)

(52) U.S. Cl.
  CPC .............. *G06F 3/0227* (2013.01); *G06F 3/03* (2013.01); *G06F 3/044* (2013.01); *G06F 3/04886* (2013.01); *G06F 3/165* (2013.01); *A45F 2003/146* (2013.01); *G06F 2203/04102* (2013.01); *H03K 17/962* (2013.01)

(56) References Cited

U.S. PATENT DOCUMENTS

| | | |
|---|---|---|
| 9,122,332 B2 | 9/2015 | Li et al. |
| 9,262,008 B2 | 2/2016 | Chao et al. |
| 2013/0044063 A1 | 2/2013 | Kim |
| 2013/0328828 A1* | 12/2013 | Tate ................. G06F 3/044 345/174 |
| 2014/0049487 A1* | 2/2014 | Konertz ............ G06F 3/041 345/173 |
| 2014/0111430 A1 | 4/2014 | Shima |
| 2014/0375769 A1* | 12/2014 | Algreatly ........... G06F 17/50 348/46 |
| 2018/0081439 A1* | 3/2018 | Daniels ............. G06F 1/163 |

* cited by examiner

APPARATUS AND METHOD FOR EXPANDED TOUCH SENSITIVE ACTUATION OF A USER INTERFACE BUTTON

RELATED APPLICATIONS

The present application is related to U.S. Ser. No. 15/335,541 commonly assigned to Motorola Solutions, Inc, and filed of even date.

FIELD OF THE INVENTION

The present invention relates generally to user interfaces for electronic devices and more particularly to a touch sensitive user interface and corresponding contact assembly.

BACKGROUND

Portable battery-powered communication devices are advantageous in many environments, but particularly in public safety environments such as fire rescue, first responder, and mission critical environments. The desire to incorporate at least some portions of the portable communication device into a body wearable apparatus, such as a harness, vest, or shoulder strap, is becoming increasingly desirable so as to facilitate access to certain radio user interface controls. Challenges arise in the design of user interface controls into a harness, vest or shoulder strap apparatus in that the tactile feedback and visibility can become problematic under certain environments. For example, glove worn operation of a body worn harness, vest, or shoulder strap device can exacerbate sensing and actuation interface issues. Hence, the ability to address user interface sensitivity with a reliable unobtrusive implementation, for body wearable harness type devices would be highly advantageous to public safety markets.

Accordingly, there is a need for an improved method and apparatus for a touch sensitive user interface of an electronic device. An improved touch sensitive user interface method and apparatus would be particularly well suited for a body wearable application in public safety radio environments where both gloved and non-gloved operations may interchangeably occur.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1A:
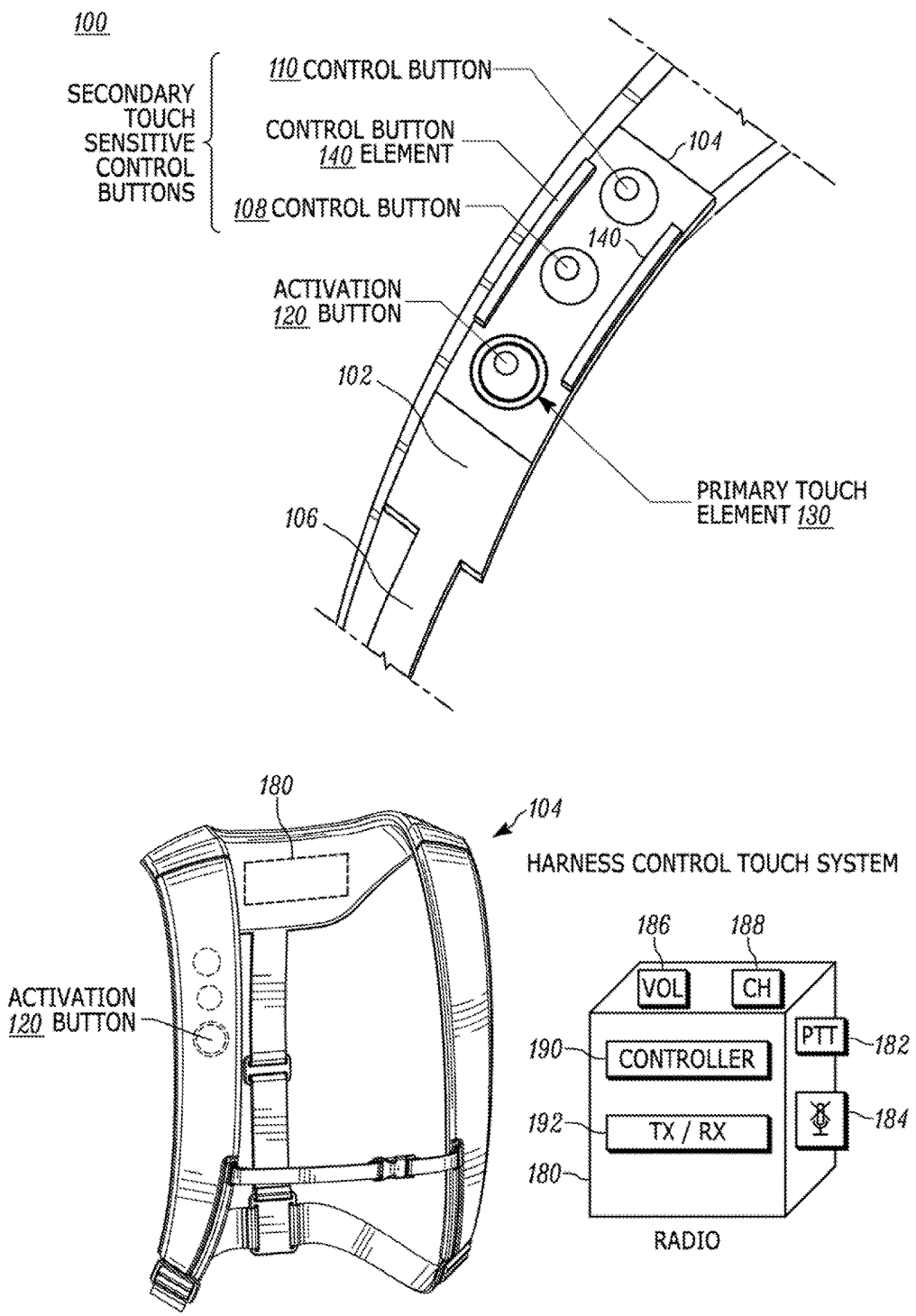
FIG. 1A is a diagram of a harness having an improved user interface comprising a single activation button and other user interface control buttons in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Briefly, in accordance with various embodiments, there is described herein a user interface for a body worn device, that provides remote access to an electronic device, such as a radio, automatically accommodates for both non-gloved and gloved mode operation with increased sensitivity levels.

In accordance with an embodiment, improved gloved and non-gloved mode detection is achieved using an activation button formed of a single, primary touch element comprising a mechanical actuator button surrounded by a touch sensitive element. The use of this primary touch element to determine gloved mode and non-gloved mode operation is based on a capacitance measurement in response to a gloved or non-gloved finger input to the button.

When gloved mode operation is determined a method is further provided that proceeds to set or adjust a sensitivity level to at least one, or a plurality of, secondary touch sensitive control buttons in accordance with the gloved mode sensitivity level. This secondary group of touch sensitive control buttons (or buttons and elements) comprises are either automatically set with the sensitivity level of the measured capacitance of the activation button or adjusted through an iterative process to account for variable parameters, such as different users and glove parameters.

In accordance with some embodiments, once gloved mode operation is established, the secondary touch button control group is increased in sensitivity level, provided with hovering haptic feedback capability, and/or combined into larger but fewer buttons.

Electronic devices, particularly those in which interchangeable non-gloved and gloved mode operation are anticipated, may now incorporate the button user interface and be provided with the advantages of increased sensitivity levels, hovering feedback capability, and/or expanded actuation areas provided by the various embodiments.

FIG. 1A is a user interface 100 integrated as part of a body wearable harness 104 formed and operating in accordance with various embodiments. User interface 100 provides a button control system providing both gloved mode and non-gloved access for controlling a remote portable communication device, such as a portable two-way radio 180. Portable radio 180 may be incorporated within the harness 104, such as incorporated within the collar (dotted lines), or coupled to the harness via an external cabled interconnect. In accordance with the various embodiments, the user interface 100 facilitates gloved operation for controlling predetermined radio functions remotely by a user wearing the harness 104.

The portable radio 180 comprises a controller/microprocessor 190, along with transceiver 192 and appropriate radio circuitry. In accordance with some embodiments, the harness 104 electronically and mechanically couples to the radio 180 via a flex interface 106 or other wired cabled interconnect. The flex interconnect 106 advantageously maintains a slim profile within the fabric of the harness 104.

In accordance with the various embodiments, the user interface system 100 of harness 104 provides a single activation button 120 for determining or establishing gloved mode/non-gloved mode operation. In accordance with the various embodiments, a first capacitive touch sensitive element 130 surrounds the activation button 120, the first capacitive touch element determining or establishing the mode of operation as being a gloved mode of operation or a non-gloved mode of operation based on the button press to button 120. In response to a gloved mode being determined by the activation button 120, all the remaining buttons on the harness which are control buttons, 108, 110, 140 convert to establish gloved mode operation.

The user interface system 100 comprises a flexible printed circuit (FPC) board 102, embedded within the harness 104, the harness can be made of fabric or other suitable material for body wearable configurations. Upon the FPC board 102 are disposed a plurality of buttons 108, 110, and 120. In accordance with the various embodiments, one of the pluralities of user interface buttons 108, 110, 120 operates as the activation button 120, also referred to as a home button. In accordance with the various embodiments the activation button 120 is formed of a single mechanical capacitive touch sensitive button, i.e. a mechanical button 120 with touch sensing element or pad 130 surrounding activated upon pressing the button.

The remaining buttons 108, 110 operate and will be referred to as interface control buttons 108, 110. Interface control buttons 108 and 110 are touching pad capacitive interface control buttons. An additional touch element 140 can be used to provide a swipe control functional touch element. All embodiments can be accommodated via the apparatus and methods of system 100. Interface control buttons 108 and 110 along with touch element 140 may be referred to as an overall 'secondary touch sensitive control button group as compared to the activation button 120 which is sometimes referred to as a 'first touch element' or primary touch sensitive activation button with reference to the interface control system 100.

In response to determining a gloved mode of activation button 120, an appropriate sensitivity level is assigned to the control buttons 108, 110, 140. The appropriate amount of sensitivity level to be assigned to the secondary touch sensitive control buttons will be calculated based on gloved finger capacitance input level measured at 130 surrounding activation button 120 when the non-match occurred (or when the capacitance measured is below certain non-gloved threshold), which would be an increased sensitivity level.

For the purposes of this application, the activation button 120 comprises a mechanical button with a conductive capacitive pad. The control buttons 108, 110, 140 are preferably embodied as capacitive touch element type buttons but may also be embodied in, electrical mechanical, touch screen, touch display, GUI, and mechanical form factors, as long as the control button is of a touch capacitance type that can have capacitance levels assigned or adjusted.

In non-gloved operation, first and second control buttons 108, 110 provide functional remote control access to certain controls of radio 180. Examples of a few remote control functions that can be accessed from radio 180 are push-to-talk (PTT) radio function 182, mute function 184, volume up/down function 186, channel up/down function 188, and/or a plurality of radio programming control functions. In accordance with the various embodiments, activation button 120 operating in accordance with the various embodiments allows control buttons 108, 110 and swipe element 140 to remotely control one or more of radio functions in non-gloved and gloved mode operation.

When switching to a gloved mode of operation, buttons 108 and 110 may become too difficult to access based on limited space, low sensitivity levels and the bulkiness and thickness of the gloves. In accordance with the various embodiments, system 100 provides the ability to maintain functional control over a harness remote radio function, without increasing the size of the harness interface.

Few examples are provided below of a swipe mode combining three (3) control buttons into one function, and another example in which individual functions for each button 108, 110, 140 are used.

Control Buttons=118, 110, and 140 all Touch Sensitive (Swipe) The activation button activates 120 gloved modes. The first touch sensing element 130 is used for measuring the capacitance of the gloved touch input to the button 120 and the controller calculates any adjustment needed to the sensitivity level, which for a swipe embodiment, may comprise all functional buttons 108, 110, and 140.

In accordance with a first embodiment of system 100, all touch sensitive elements 140, 108, 110 may operate as a single combined swipe button during gloved mode of operation. This swipe control for example may provide volume up/down or channel up down during gloved mode operation.

For example, if buttons 108, 110, 140 control volume up/down during non-glove mode and then activation button 120 senses gloved mode operation, then button controls 108, 110, 140 increases their sensitivity levels providing a swiping capability across the entire region between the space between the buttons and along the edges of touch element 140. Thus, the control volume up/down functionality has been retained in gloved mode with ease of access and increased sensitivity.

Individual Functions (for 108, 110 and 140) Glove/Non-Glove

In accordance with a second embodiment of system 100, the first and second control buttons 108, 110, are embodied as touch element control buttons. The touch element 140 is embodied as a touch element in a swipe control button configuration.

In non-gloved operation, control button 108 may be a radio mute control function, while control button 110 may control a remote PTT function, and swipe touch element 140 may control volume up/down. All control functions mute, PTT and volume +/_ are being remotely controlled from the radio 180.

In accordance with the various embodiments, activation button 120 establishes a gloved mode of operation based on a gloved finger input. In response to activation of gloved mode operation, sensitivity levels to first control button 108 and second control button 110 and third control element 140 are all increased by controller 190. The increased sensitivity level can be set by default, adjusted or assigned to match that of the capacitance level associated with the gloved input with the activation button 120. Thus, system 100 provides for automatic detection of a gloved finger input and adjust sensitivity levels of control buttons automatically. If the control buttons 108, 110, 140 are closely situated to each other then different sensitivity levels may be assigned to each of the control buttons 108, 110 and control element 140. So for example, PTT may be assigned to button control 108, mute control function may be assigned to button control 110 and volume up/down control may be assigned to slide element 140 all with assigned increased sensitivity levels for responding to gloved finger touch.

If the control buttons 108, 110, 140 are closely situated to each other then different sensitivity levels may be assigned to each of the control buttons 108, 110 and control element 140. Haptic feedback 170 can further be used to help identify one control feature by hovering a gloved finger over the buttons. Control button feedback is mimicked by activating haptic generator 170 to produce a feedback vibrating based on control button assignment.

Haptic feedback in the form of a vibrational alert can be sensed in response to hovering over each of the control buttons 108, 110, and touch element 140, prior to pressing any of the controls 108, 110, or 140 wherein each button has its own vibration alert associated therewith. The vibration alert need not come from the button area directly but may come from the haptic alert signal 170 as the user approaches each individual button area.

Thus, the use of the activation button 120 and haptic feedback 170 has provided for control buttons 108, 110, 140 on a harness 104 to control such functions as PTT, mute and volume up/down functionality in gloved mode with increased sensitivity and haptic feedback, improving ease of access for gloved usage thereby minimizing false triggering.

In the past, the ability to differentiate control function buttons would have been difficult, particularly on a harness, either multiple presses would have been needed or overly-increased sensitivity levels would easily have resulted in false triggering. However, in accordance with various embodiments, activation button 120 allows for an improved user interface of a remote control function. The physical "press-area" of the mechanical button is maintained in gloved-mode (i.e. the physical press area is not disturbed) thereby minimizing false key presses and advantageously maintaining the original form factor of the buttons and harness. Once gloved mode operation is established, the increased sensitivity level is triggered along with predetermined vibration alerts for each button 108, 110, 140 in gloved-mode operation. The vibration alerts can be triggered by hovering over the button, determining the appropriate button to press, and pressing the button. The use of activation button 120 allows for a variety of embodiments in which all three control buttons 108, 110, and 140 remain functional in glove mode operation.

Figure 1B:
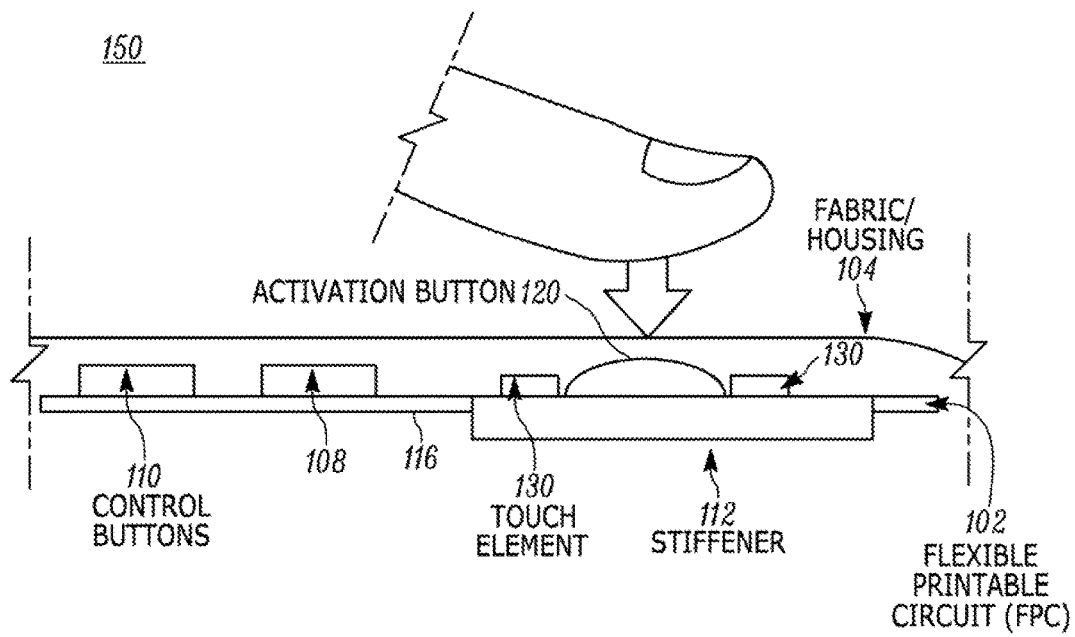
FIG. 1B is a partial cross-sectional view of FIG. 1A showing a stack-up assembly with non-gloved finger input to the single touch button control of the user interface in accordance with some embodiments.

FIG. 1B is a partial cross-sectional view of the activation button 120 and partial control button in accordance with the various embodiments. The activation button 120 is shown as stack-up assembly 150, with control buttons 108, 110 in accordance with some embodiments.

In accordance with the various embodiments, the stack-up assembly 150 comprises flexible printable circuit 102 having an upper surface 114 and lower surface 116. Activation button 120 is disposed upon upper surface 114. Activation button 120 is a mechanical button, such as a metal popple dome. Surrounding the activation button 120, and disposed upon the FPC 104, is the first touch element 130. Touch element 130 sense the capacitance of the touch (with or without glove) in response to the mechanical button 120 being pressed to discriminate if the activation button is pressed by finger or gloved finger and when a gloved finger is determined then making any appropriate sensitivity adjustment needed based on the measured capacitance. The measured capacitance in gloved mode will vary based on the thickness and type of glove and thus different compensation or adjustment of the sensitivity will be applied to the second touch sensitive control buttons (108, 110, 140).

A stiffener element 112 may be coupled to the lower surface 116 beneath activation button 120 and touch element 130, thereby increasing the tactile feedback of a button press. In operation, the mechanical button 120 being pressed will activate the capacitance touch sensing circuit to sense the capacitance of the touch to determine the appropriate sensitivity adjustment to the second touch element. When a match occurs to a preset value (or not below non-glove operation threshold), non-gloved mode operation is established. If the measured capacitance is not matching the non-glove capacitance level, then a gloved mode will be triggered and sensitivity of the secondary touch sensitive control buttons element (108 and 110) will be adjusted according to the measured capacitance.

Figure 1C:
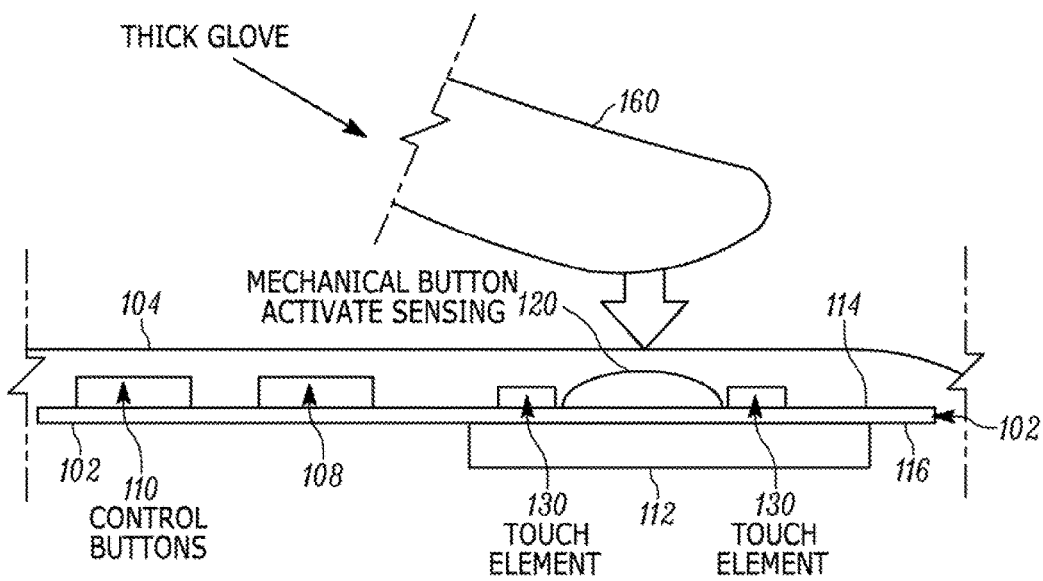
FIG. 1C is another cross-sectional view FIG. 1A showing the stack-up assembly with a gloved finger input to the single touch button control of the user interface in accordance with some embodiments.

FIG. 1C is a partial cross-sectional view of a stack-up assembly of the single activation button 120 in accordance with a gloved finger input in accordance with some embodiments. In this embodiment the stack up remains the same as in FIG. 1B with flexible printable circuit 102, activation button 120, first touch element 130, and secondary touch sensitive control buttons 108, 110 (140 not shown).

For gloved mode operation settings to be established, touch element 130 senses the capacitance level of the gloved touch in response to being pressed by a gloved finger. This gloved capacitance value is compared to the preset value of the non-gloved setting already saved to memory. The preset value can also be a default value. Since the values of non-gloved finger and gloved finger inputs will not match, the controller 190 will calculate the appropriate sensitivity adjustment of sensitivity levels for control buttons 108 and 110, based on the capacitance measured by activation button 120's associated touch element 130.

The increased sensitivity, applied to touch element 140 will be triggered once a glove input approaches. However, rather than triggering a function at control button 108 or 110, a haptic feedback will be generated indicative of which button 108 or 110 is being approached. The function of button 108 or button 110 will be triggered once the user presses on the desired identified button.

Accordingly, the improved user interface 100 provided by the embodiments allows radio 180 to be remotely controlled by a body worn harness 104 that accommodates both gloved and non-gloved usage through the use of the improved activation button 120 formed and operating in accordance with the various embodiments. Converting between non-gloved to gloved modes can be easily achieved by easily pressing the activation button 120 with a single press, avoiding multiple key presses. Only a single activation press of the activation button 120 is needed to enter glove or non-glove mode, thereby avoiding multiple key presses. In other words, after pressing the activation button 120 with a gloved input, all the secondary touch sensitive control buttons operating as control functions 108, 110, 140 will be converted into gloved mode (or converted back to non-gloved mode in response to a non-gloved input). Depending on the embodiment, these control buttons could be separate control functions as previously described such as PTT 108, mute 110, and volume up/down 140. Hence, in accordance with the embodiments, one or a plurality of secondary touch sensitive control buttons provide one or more remote gloved controls for accessing a portable communication device.

The embodiments presented thus far have further shown the benefits of haptic feedback for embodiments with more than one button control function is available, for example separate functions for 108, 110 and 104. Glove mode operation allows the user to hover over buttons to receive haptic feedback generated from a source located on the harness to discriminate between buttons. The user identifies a desired button based on a vibration alert associated with that button control. In response to the user sensing a predetermined vibration signal, the user presses a button based on the identification. Thus, a further advantage of the various embodiments, is the avoidance of false triggering of buttons though the application of haptic feedback to properly identify individual control buttons, such as 108 being a PTT function, 110 being a mute function and 140 being a volume up/down function.

Figure 2:
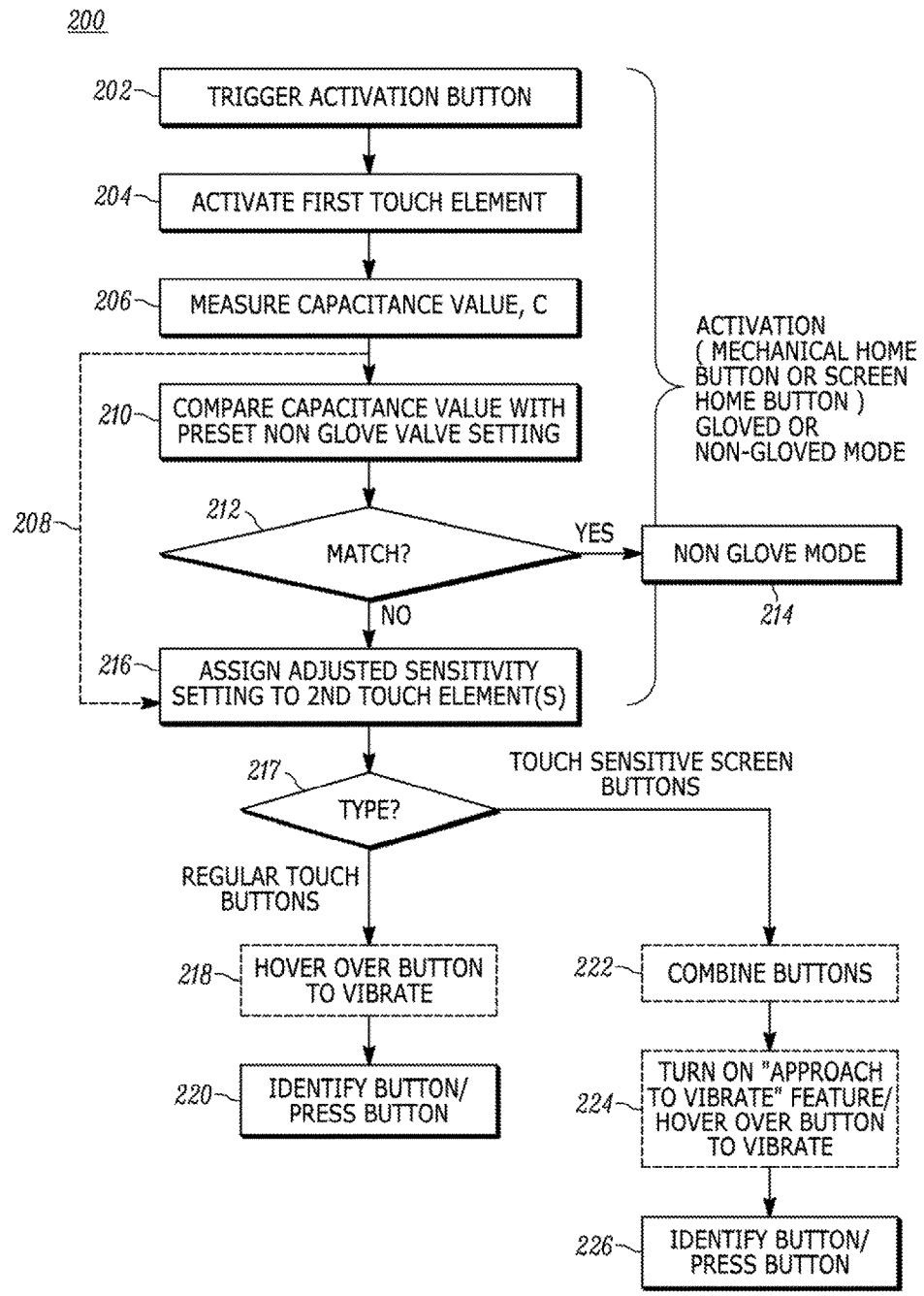
FIG. 2 is a method to determine gloved or non-gloved mode and adjust sensitivity of a touch sensitive user interface control button in accordance with some embodiments.

FIG. 2 is a method 200 to adjust sensitivity level of a user interface for controlling for non-gloved and gloved mode operation in accordance with some embodiments. The method 200 enables activation button 120 of user interface 100 to control sensitivity levels of the control buttons 108, 110, 140 also of user interface 100 which couples and provide remote accessibility and control to the radio 180.

Method 200 begins by triggering 202 activation button 120 on the harness 104. The activation button 120 comprises a mechanical activation button, such as mechanical activation button 120 with touch sensing element 130 of FIG. 1. As previously described, the activation button 120 has a first capacitance touch sensitive element 130 associated therewith which is activated in response to being triggered. The first or primary touch sensing element 130 in response to being triggered provides the input to the secondary touch control button formed of touch elements 108, 140, 110. As discussed previously, the secondary touch sensitive control buttons could be mechanical touch elements having touch sensitive sensors associated therewith, or other type of capacitive touch sensitive elements.

Referring to method 200, triggering at 202 is enabled by a gloved finger press or a non-gloved finger press to the activation button. In response to triggering the activation button at 202, a first capacitance touch element associated with the activation button, is activated at 204 and a capacitance value is measured at 206.

In some embodiments of method 200, the capacitance that is measured at 206 can then be used directly (referring to bypass 208) as an input to calculate and assign an appropriate sensitivity level for the secondary touch sensitive control buttons (108, 110, 140) at 216 thereby increasing the sensitivity level. In other words, even in non-glove mode, different fingers of different sizes from different people might need different optimized sensitivity levels and thus the sensitivity of secondary touch sensitive control buttons (108, 110, 140) can just be adjusted and optimized based on the measured capacitance value. Using only the measured capacitance value at 208 beneficially avoids the use of setting any comparisons, thresholds, and advantageously provides a 'real-time' continuous optimal adjustment, rather than a discrete step adjustment.

Going back to 206, in other embodiments, the measured capacitance value at 206 does proceed to be compared at 210 to a preset value associated with a non-gloved condition saved in memory, such the memory of controller section 190 of the radio 180.

Method 200 continues with a determination is made at 212 as to whether there is a match indicative of a non-gloved condition, and when such a match is indicated, then operation in non-gloved mode at 214 is established. Up to this point, method 200 has measured the capacitance value input received from a first touch element of an activation button and enabled automatic switching from a non-gloved mode to a gloved-mode or vice versa. It is the subsequent use of this measured capacitance value for gloved mode operation going forward that enables the various embodiments for increased touch button sensitivity and increased display touch button sensitivity with combined buttons.

When, the determination at 212 is indicative of a non-match to the preset value for non-gloved mode, then an adjusted sensitivity level is automatically assigned to the second capacitance touch sensitive control button at 216, thereby establishing a gloved mode condition.

In accordance with the various embodiments, both mechanical button and display button embodiments are covered by method 200 moving forward.

For a mechanical activation button operation, referring back to FIG. 1, the capacitance measured at first capacitance touch sensitive element 130 (with the glove on) is assigned to secondary touch sensitive control buttons 108, 110 and 140. Accordingly, a gloved finger can press one of the buttons 108 or 110 or 140 to enable a respective control function. In accordance with some embodiments, the increased sensitivity provided to second touch sensitive control buttons 108, 110, 140 allows each button to be more easily triggered in response to be pressed.

Additionally, referring still to method 200, for regular touch type buttons, as determined at 217, a vibration alert can optionally be turned on at 218 to provide improved button differentiation and identification if desired. The haptic feedback 170 of FIG. 1A generates the vibrating signal in response to sensing a finger hovering over a predetermined area above each respective button at 218. The user will be able to discriminate between different vibration alerts for each of the different control buttons 108, 110, 140, thus allowing the user to identify and press the desired button at 220. The use of vibration button identification beneficially allows more buttons to remain functional in environments where visibility may be limited.

Moving over to a touch sensitive display button operation of method 200, the initial steps 202-214 are the same, however the activation button is a display type activation button having a first capacitance touch sensitive element associated therewith (as opposed to a mechanical button).

At 216, the capacitance measured at a first capacitance touch sensitive element (with the glove on) is used to calculate the appropriate sensitivity to be assigned to second touch sensitive control buttons thereby increasing the sensitivity level. However, in accordance with the touch sensitive display button embodiment, the second touch sensitive control buttons are in the form of a plurality of touch sensitive display buttons.

In accordance with the display type embodiment, as determined as 217, and as will be shown and described in subsequent figures, these control buttons are combined into fewer and larger buttons at 222. In accordance with the display type embodiment, the gloved finger can then advantageously hover for tactile feedback and touch for activation over fewer but larger buttons to activate different control functions at 226.

Here again, a vibration alert can optionally be added and turned on at 224 to provide improved button identification differentiation, if desired. The vibrating signal can be triggered in response to sensing a finger hovering over the display area of each respective enlarged button at 224. The user will be able to discriminate between different vibration alerts for each of the different control buttons, thus allowing the user to properly identify and press the desired button at 226.

The advantages of method 200 as applied to the mechanical or touch button control button embodiments include maintaining the physical "press-area" of the button during gloved-mode operation, while the increasing the sensitivity level assigned to the second touch sensitive control buttons to facilitate gloved mode operation. The assigned increase in sensitivity levels for gloved mode operation allows the addition of haptic functionality which further permits hovering over individual buttons to sense for individual vibrating alerts. These vibrating alerts advantageously identify individual control buttons. A user can thus identify which control button to press based on the sensed vibration. Another benefit to the haptic feedback is that the vibration continues to provide tactile feedback to the user during touch press activation of a control button, which further minimizes false triggering of a control button.

The advantages of method 200 as applied to the display button embodiment will be described further in conjunction with the following descriptions. Briefly, the advantages of the display button embodiment include increased sensitivity level and larger buttons. Haptic feedback also beneficially provides tactile feedback during touch activation.

Figure 3A:
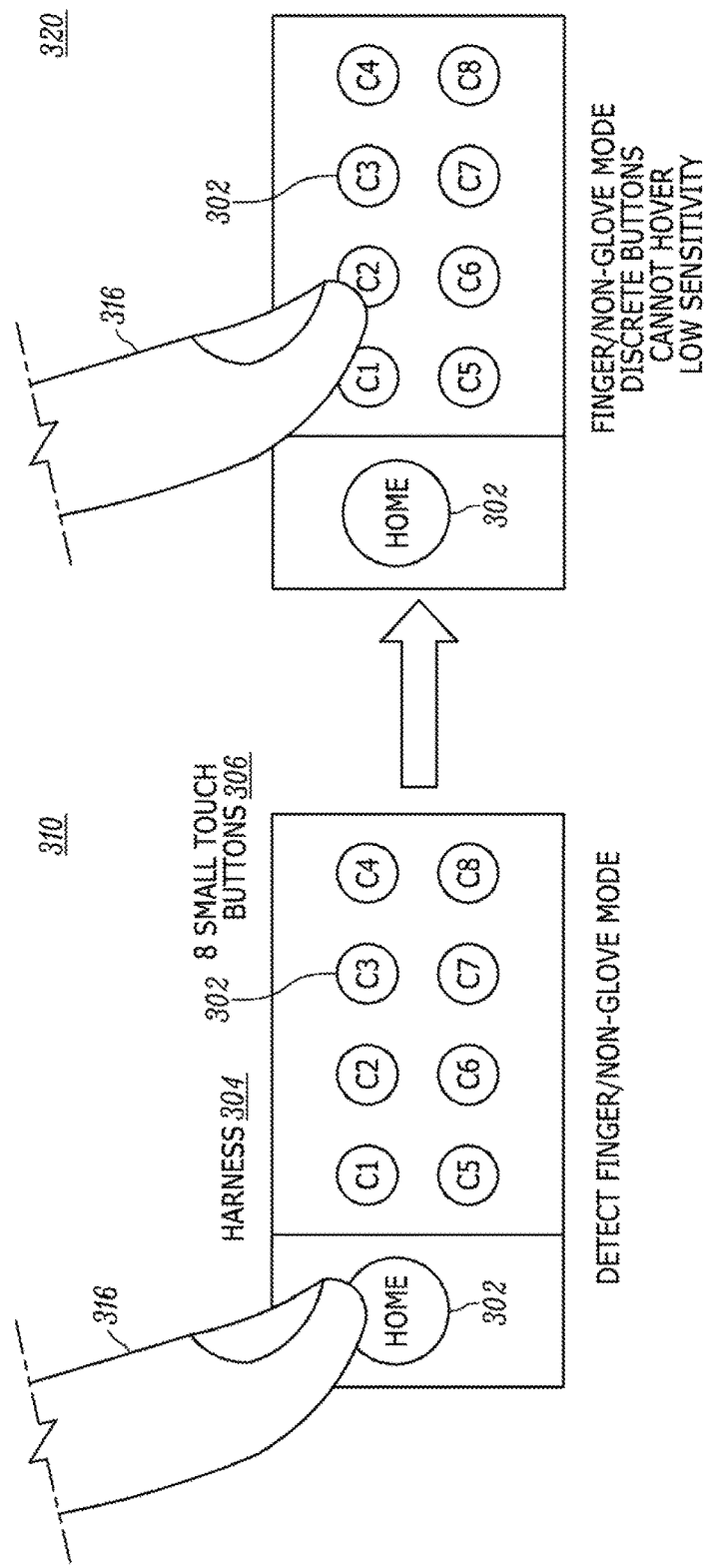
FIG. 3A and FIG. 3B show a user interface system for an electronic device, such as a radio, comparing operation in non-gloved mode operation to gloved-mode operation in accordance with a display button embodiment.
Figure 3B:
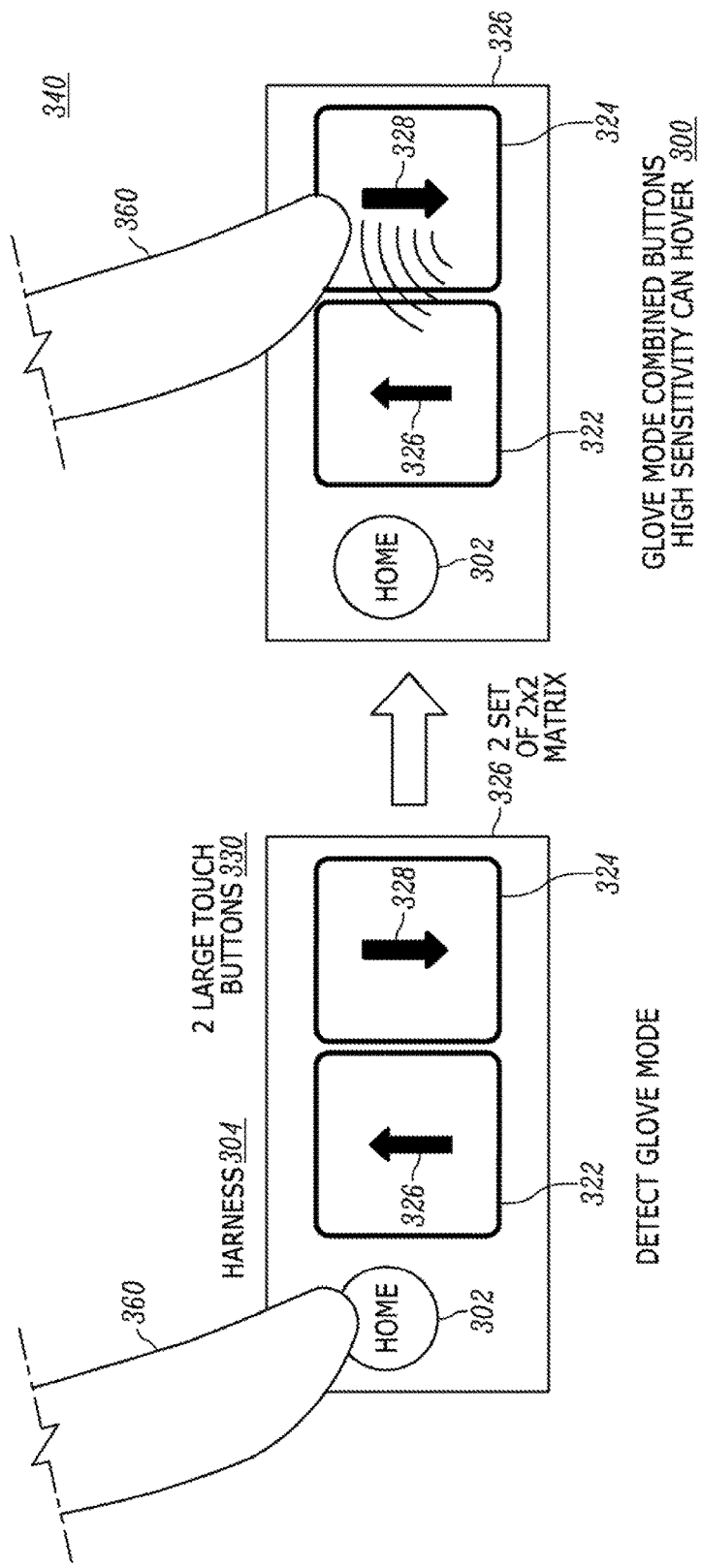

FIG. 3A and FIG. 3B show a user interface system 300 for an electronic device comparing operation in non-gloved mode operation to gloved-mode operation in accordance with a display, screen, or graphical user interface (GUI) button embodiment. In a screen type embodiment, an activation button 302 is formed of a capacitance touch element located beneath a translucent screen, capacitive touch is able to be measured through the screen. The touch button user interface 300 may be located on a harness 304 or other, strap, vest or body wearable item and remotely coupled to an electronic device, such as a portable radio, or formed directly as part of the electronic device itself, such as a smart watch or portable radio. The touch button user interface 300 advantageously facilitates the ability to access and control various user interface controls of the electronic device which may be visually difficult to see, feel, sense or get to due to encumbering equipment and/or environmental conditions, such as smoke and loud noise. The electronic device may be for example, a portable battery operated communication device under microprocessor control, such as the public safety two-way radio 180 of FIG. 1A.

View 310 shows non-gloved finger input 355 touching an activation button 302, also referred to as a home button, having a first capacitive touch sensitive element associated therewith. The capacitance associated with the first capacitance element is measured and may, as previously discussed in method 200, be determined and assigned using a continuous sensitivity optimization, thereby directly providing a touch sensitive matrix of buttons without going through a comparing and matching process. Alternatively, the capacitance associated with the first capacitance element is measured and may be, as previously described in method 200, be compared to a preset, non-gloved mode value previously saved to memory.

A match indicative of a non-gloved condition results in a plurality of small discrete buttons, such as first matrix of small touch buttons forming a [2×8] matrix 306. In this embodiment, the first matrix of buttons 306 provides eight small touch buttons, with characters indicators C1, C2, C3, C4, C5, C6, C7 and C8.

As shown in view 320, non-gloved mode operation provides discrete buttons which can be accessed by touching the display with a finger. Each button is enabled by a finger touch to a respective button with respective a touch button that will be activated with a lower sensitivity level compared to gloved operation.

In accordance with a gloved finger embodiment, the capacitance value input received from the first touch element of the activation button 302 enables automatic switching from the non-gloved mode to the gloved-mode when the measured capacitance value is a non-match for the preset value for non-glove operation. In accordance with the embodiments of FIG. 3, the plurality of smaller touch automatically are combined, in response to a gloved-finger input to the activation button, to form first and second larger touch button elements, for gloved-mode operation.

Moving to view 330, the discrete touch elements are shown combined and formed into two larger touch elements 322, 324 in response to a gloved-finger 360 input to activation button 302. A larger artwork is light on the display to form a new larger button boundary. View 330 shows a larger artwork that lights up on the display to form two new larger button boundaries as a result of the smaller discrete buttons being combined, which in this example converts into two [2×2] matrix 326. Other matrix sizes and combinations are possible, and those shown and described are for example purposes only. The identification of which user interface control (e.g. C1 or C2 . . . or C8) gets transferred to gloved-mode operation is predetermined. Also, additional groupings and combinations of smaller touch elements can be combined to form larger touch elements for ease of glove-mode operation. Thus, an expanded user interface size, in terms of the landing size for the gloved finger, is provided with increased sensitivity level, without increasing the overall physical dimensions of the outer boundary of a device.

In accordance with an embodiment shown in view 340, gloved finger input 360 to activation button 302 generates two larger buttons 322, 324. In accordance with a further embodiment, the two buttons 322, 324 operating in gloved mode are assigned to high sensitivity levels. In accordance with an even further embodiment, hovering over a button with the gloved finger 360 will trigger the high sensitivity levels and provide tactile feedback to identify a button. This tactile feedback may be in the form of a vibration alert which is triggered when the gloved finger comes within a predetermined space of the control button and hover over the button. The vibration levels have been set so as to be sensed through the glove while hovering over the button. Again, each control button has its own assigned vibration alert associated thereto. A control button is activated by touching the desired button with gloved finger 360. In accordance with the touch screen embodiment, the sensed capacitance level to trigger hovering haptic feedback versus touch activating the control button can be determined and calibrated through the capacitance sensed by the activation button 302. In accordance with the screen home button embodiment, the touch sensor at activation button 302 is able to determine the capacitance that is considered "touch" and what capacitance is considered "hover". The capacitance sensed by the activation button 302 is the capacitance when it is touched, within a range lower than the capacitance value used for the "hovering" capacitance range.

Figure 3C:
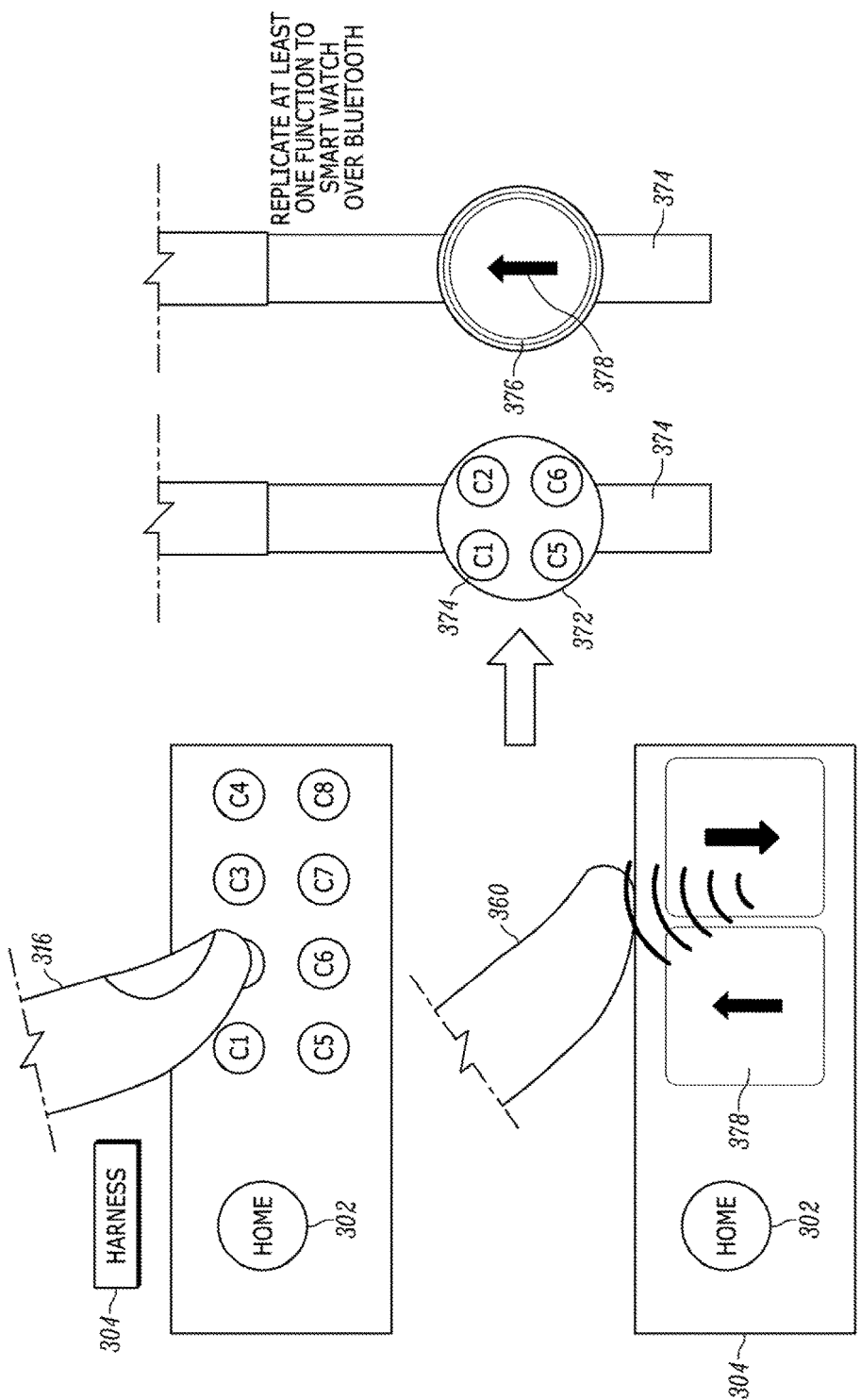
FIG. 3C shows the harness of FIG. 3A being used in conjunction with a smart watch in accordance with an extended embodiment.

FIG. 3C shows a harness 304 being used in conjunction with a smart watch 370 in accordance with an extended embodiment. In addition to radio 180, the touch screen harness 304 may be further extended to another wearable collaborative device working with the harness 304, such as the smart watch device 370. Smart watch 370 can be Bluetooth paired with the harness 304 and the activation button 302 on the harness 304 can enable discrete capacitive touch sensing buttons C1, C2, C5, C6. in non-gloved mode.

In accordance with the smart watch embodiment, the activation button 302 of the harness 304 is pressed, the capacitance of the touch is measured at touch element 302 and then used to configure the sensitivity of the harness 304 touch elements as well as smart watch 370. If a threshold is exceeded and determined as gloved operation, then the buttons on both the harness 304 and smart watch 370 can be combined. In other words, the activation button 302 of the harness 304 is used to "inform" the smart watch 370 that the user is in glove mode and thus the smart watch 370 should be configured into gloved user interface mode.

As an example, in response to activation button 302 triggering gloved mode operation at the harness 304, the second touch sensitive elements C1, C2, C5, C6. located on the watch device 370 will be "combined" on the watch display (for example 4 buttons combine into one functional control button 378. A sensitivity level for the single button 378 will be increased, as compared to the four individual buttons. In this example a single arrow button 378 is shown with increased sensitivity level. A gloved finger can hover over and touch the single arrow button to activate that particular function. Adding the watch 370 to the harness system 304 can be used to increase the amount of "larger" buttons available to a user and also put a particular function for gloved mode in a specific desired location as part of an overall system of harness and watch.

Figure 3D:
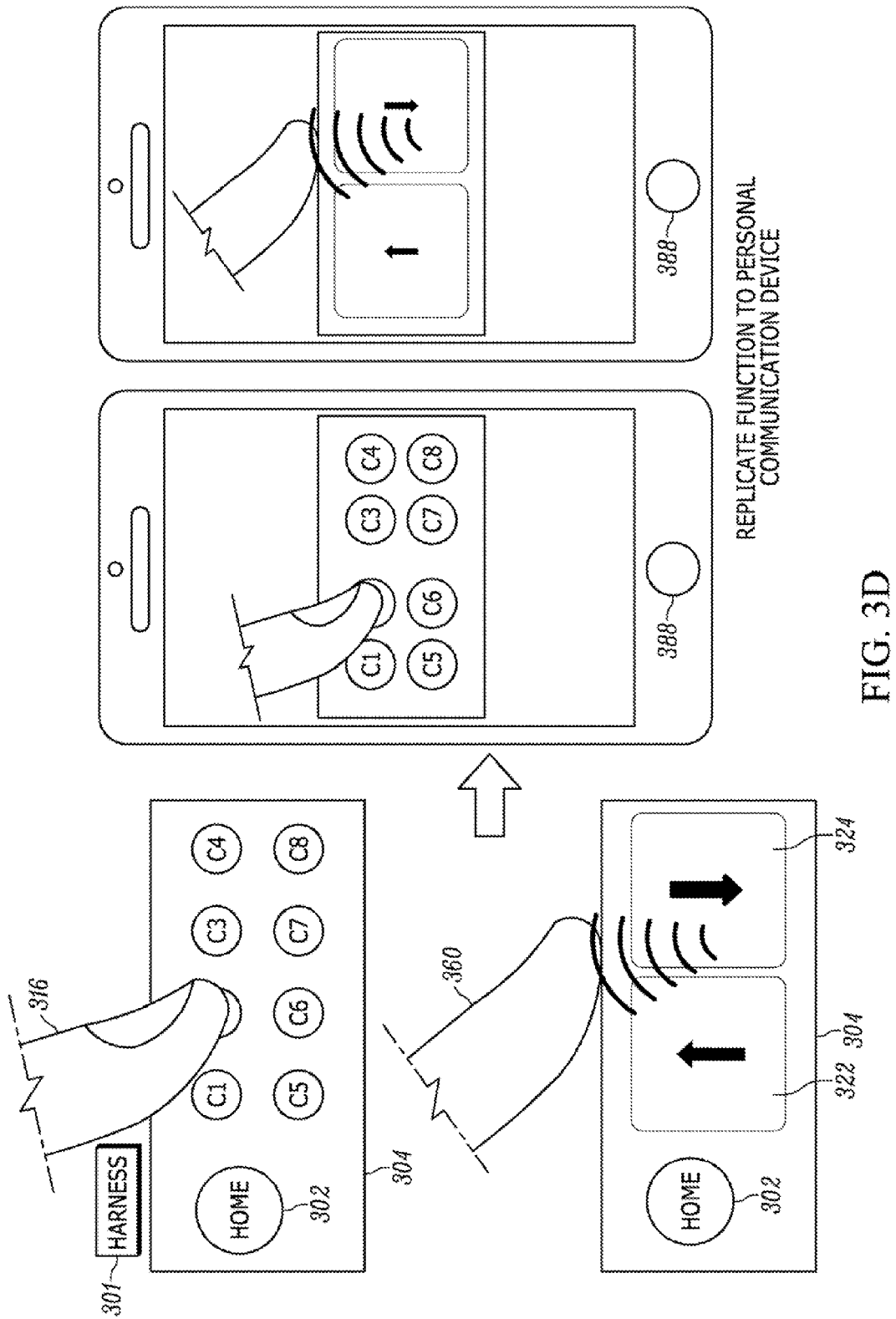
FIG. 3D shows the harness of FIG. 3A being used in conjunction with a smart phone in accordance with an extended embodiment.

FIG. 3D shows the harness 304 being used in conjunction with a personal communication device, or smart phone, 380 in accordance with an extended embodiment. In accordance with this embodiment, the touch screen harness extends radio functions, such as from radio 180 of FIG. 1 to a wearable collaborative device working with the harness 304, such as smart phone 380. The touch screen display module can be incorporated into the collaborative personal communicator. Smart phone 380 can be Bluetooth paired with the harness 304, the harness 304 being wired to the radio 180 via flex 106 and the activation button 302 on the harness 304 can enable discrete capacitive touch sensing buttons C1, C2, C5, C6 in non-gloved mode.

In another alternative embodiment, the Smartphone may utilize a home activation button 388 integrated with a touch sensing element, formed and operating in accordance with the various embodiments to enable the Smartphone to determine if it is being activated in a gloved or non-gloved mode and then configure the sensitivity levels accordingly and buttons accordingly. Thus, a Smartphone that may have been working as a collaborative device with radio 180 through user interface 100 can also be removed from the system and operate independently using the improved apparatus and method for improved touch sensitive actuation providing increased control button sensitivity and expanded control button availability for environments where it is desirable to change from non-gloved to gloved mode operation.

In response to activation button 302 triggering gloved mode operation at the harness, the second touch elements C1, C2, C5, C6. located on the smart phone 380 will be "combined" on the smart phone display (for example 4 buttons into 1 arrow button) and a sensitivity level for the single button will be increased, as compared to the four individual buttons. In this example a single arrow button is shown with increased sensitivity level. A gloved finger can hover over or touch the single arrow button to activate that particular function. Adding the smart phone to the harness system can be used to increase the available amount of "larger" buttons available to a user and also put a particular function for gloved mode in a specific desired location as part of an overall system of harness and personal smart phone.

Alternatively, an activation button 388 on the personal communication device 380 can be used to sense gloved and non-gloved input, and the personal communication device could be wireless communicating with a radio over Bluetooth, such as radio 180 of FIG. 1 worn at the user's belt. The personal communication device 380, in response to non-gloved and gloved inputs, can switch between touch/discrete screen buttons and to a larger combined hover screen button.

Accordingly, for the various embodiments in which the activation button and the plurality of control buttons are all comprised of touch sensing elements (without any mechanical buttons), then the control buttons will have increased sensitivity levels associated therewith: a hovering sensitivity level (for controlling button identification) and a touch sensitivity level (to enable activation of the control buttons). These levels may also be adjusted as previously described.

Figure 4A:
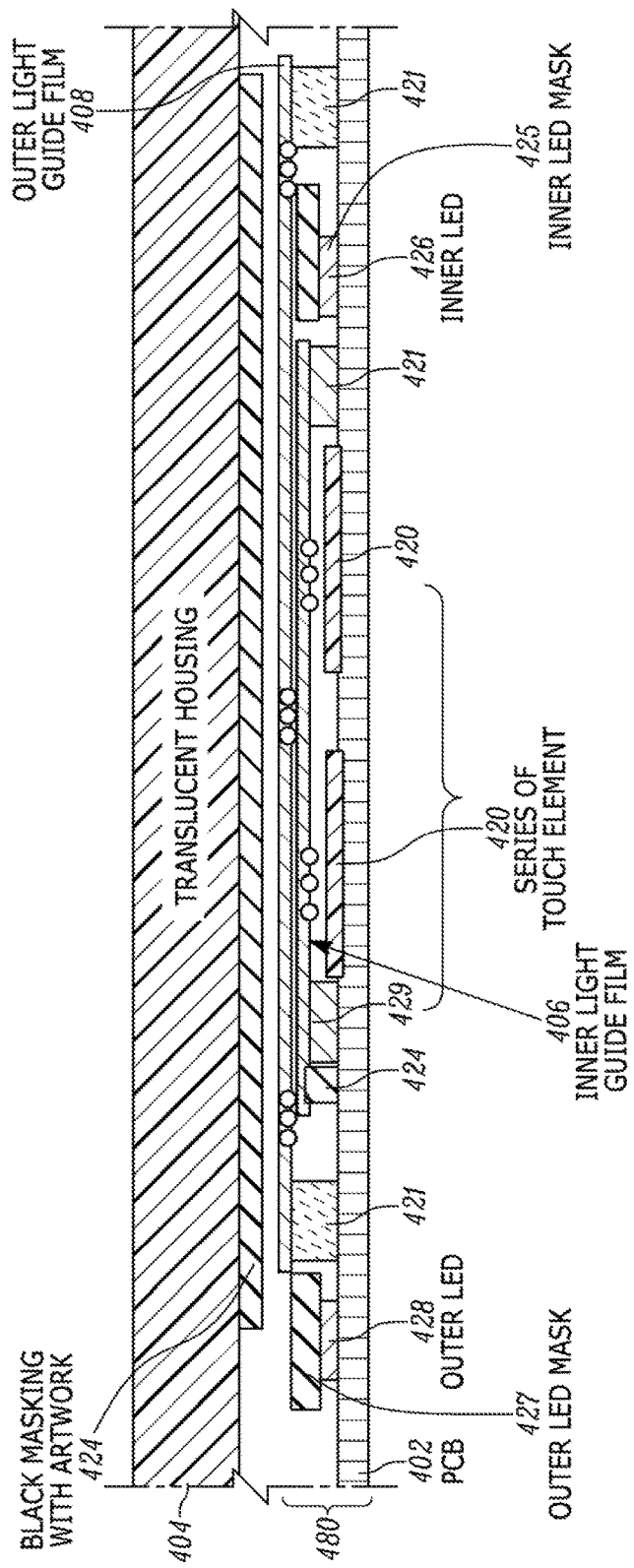
FIG. 4A is a cross-sectional view of a touch sensitive display type stack-up assembly for an electronic device in accordance with some of the embodiments.

FIG. 4A is a cross-section view of an electronic device 400 comprising a touch screen sensitive button assembly formed and operating in accordance with some of the embodiments. The stack-up assembly is representative of an assembly that can be used for the touch button user interface of FIGS. 3A-D.

A translucent housing portion 404, a masked artwork 424 disposed against the translucent housing 404, and a touch sensitive button assembly 480 formed and operating in accordance with the combined button approach. The touch sensitive button assembly 480 comprises a substrate, such as a printed circuit board (pcb) 402, having a plurality of touch sensitive elements 420 disposed on the pcb. Inner and outer light guide film layers 406, 408 are provided. The open circles shown within the inner and outer light guide film layers 406, 408 are provided as indicators as to where illumination may pass from each of the light guide film layers, light guide film layer 406 or light guide film layer 408, through to the masked artwork layer 404 for the different operating mode of non-gloved operation and gloved operation as will be described in conjunction with FIGS. 4B and 4C.

Although these are first and second stacked light guide film layers, the interior film layer 406 provides the illumination to the masked artwork 424 for the smaller non-gloved mode buttons. In accordance with the embodiment, the wider spanning film layer 408 provides the illumination for the larger gloved-mode combined key. The inner light guide film layer 406 covers the plurality of touch sensitive elements 420. The inner light guide film layer 406 may be coupled to the pcb 402 with a first adhesive element 421. The outer light guide film layer 408 covers the inner light guide film layer 406, the plurality of touch sensitive elements 420, and is also coupled to the pcb with a second adhesive element 421 taller than the first adhesive element.

An inner LED 426, which may be part of a pair of LEDs, is disposed on the pcb 402, the inner LED having partial masking 425 disposed thereon, the inner LED being located outside of the inner light guide film layer 406 and beneath the outer light guide film layer 408, and the inner LED 426 being located beneath the masked artwork 424 of the translucent housing 404. For example, each button touch element may have its own character or symbol surround by a boundary outline.

An outer LED 428, which may be part of a pair of LEDs, is disposed on the pcb 402, the outer LED 428 having outer partial masking 427 disposed thereon. The outer LED 428 is located outside of both the inner light guide film layer 406 and the outer light guide film layer 408. The outer LED 428 is located beneath the masked artwork 424, the masked artwork 424 being disposed against and beneath the translucent housing 404

Additional masking 429 may be added to prevent bleed through of artwork that might otherwise occur if the outer light guide film layer 408 where to bleed through to the inner light guide film layer 406.

Figure 4B:
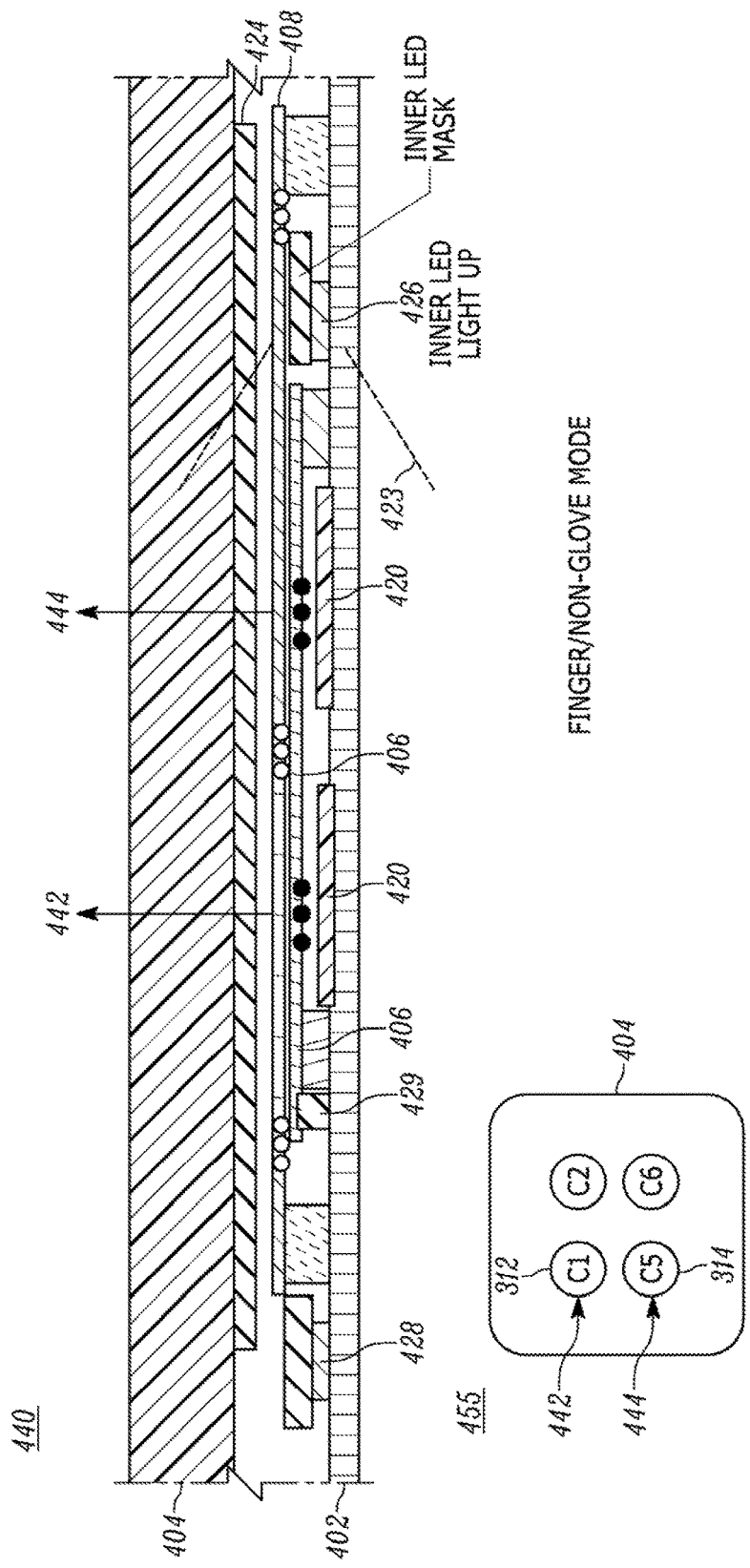
FIG. 4B is a cross-sectional view of the touch sensitive display stack-up illumination operation and corresponding illuminated user interface for non gloved mode operation in accordance with some of the embodiments.

FIG. 4B is a cross-sectional view of the touch sensitive screen button assembly 440 and a portion of the corresponding top view of the user interface 445 illuminated in non gloved-mode in accordance with some of the embodiments. In this view, inner LED 426 disposed on the pcb 402 is lit 423. Here again, the inner LED 426 is disposed on the pcb 402, the inner LED being partially masked 425, the inner LED being located outside of the inner light guide film layer 406 and beneath the outer light guide film layer 408 and also beneath the masked artwork 424, the masked artwork 424 being disposed against the translucent housing 404.

In non-gloved mode operation, the inner light guide film layer 406 is illuminated and illumination 442 and illumination 444 pass through the masked artwork 424 forming a plurality of small buttons each having own character or symbol. The illumination through masked artwork 424 with illumination paths 442, 444 shows through translucent housing 404 as a plurality of buttons, such as button C1 and C5 shown in top view 445. These buttons correspond with buttons 312 and 314 from FIG. 3. The illumination through masked artwork 424 with illumination paths shows through translucent housing 404 as a plurality of buttons can be used to provide additional or fewer buttons for an electronic device. The plurality of touch element buttons provide a user interface for the electronic device for non gloved mode operation.

In accordance with the various embodiments, in response to a gloved input to the translucent housing portion 402 a controller of the electronic device will sense a non-match to a preset capacitance and will adjust sensitivity by combining buttons, such as back at step 222 of FIG. 2.

Figure 4C:
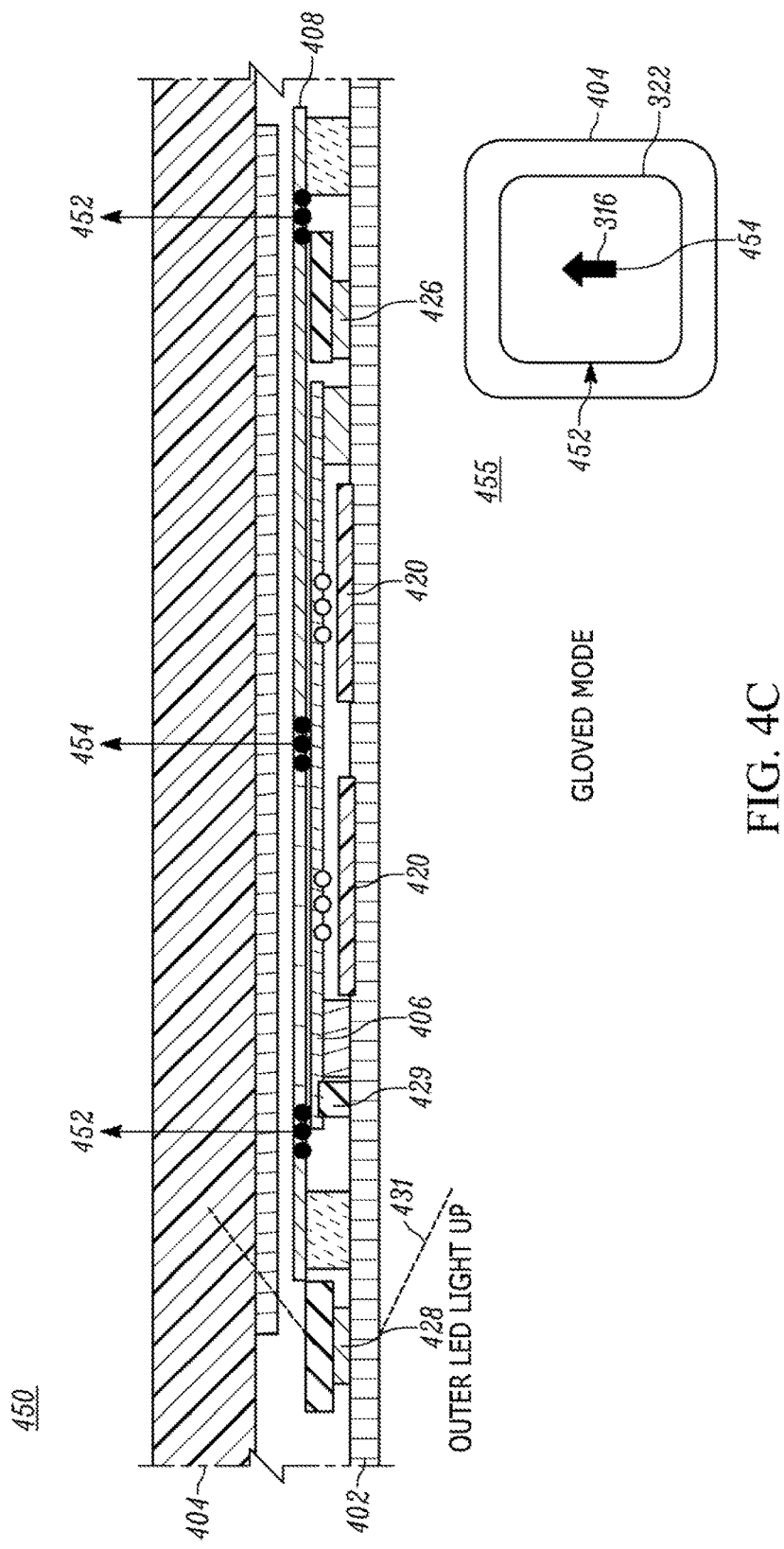
FIG. 4C is a cross-sectional of the touch sensitive display stack-up illumination operation and corresponding illuminated user interface for gloved-mode operation in accordance with some of the embodiments.

FIG. 4C is a cross-sectional view the touch screen sensitive button assembly 450 and a portion of corresponding top view of the user interface 455 illuminated in gloved-mode in accordance with some of the embodiments. In this view, outer LED 428 disposed on the pcb 402 is lit 431. The outer LED 428 being partially masked 427, and the outer LED is located outside of both the inner light guide film layer and the outer light guide film layer 408, and the outer LED being at least partially located beneath the masked artwork of the translucent housing portion. In cross section 450, the LED 428 is illumined providing illumination through masked artwork at 454 which shows through translucent housing 404 as a symbol or character 454, such as an arrow, as seen in top view 455. The illumination through masked artwork at 452 shows through translucent housing 404 as a border 454, as seen in top view 455. In this example the masked artwork 424 provides for illuminated border 452 outlining a boundary for an arrow 454. The arrow 454 within boundary 452 represents an electronic control function user interface of the electronic device. The arrow 454 within boundary 452 corresponds with button 322 from FIG. 3. Thus, the stack-up and operation provided by FIG. 4C represents an electronic control function user interface for the electronic device.

The cross sectional assembly views being illuminated for non-gloved mode (FIG. 4B) and illuminated gloved mode operation (FIG. 4C) provide a visual indication of the transition that takes place for expanded touch sensitive actuation. The user of fewer and larger buttons is easier for the user to control under visually changing environments. As discussed previously, even under extremely poor visibility conditions, the use of the increased level of sensitivity of the larger buttons formed in accordance with the various embodiments such as with the addition of haptic feedback can be used to facilitate locating the button, when such buttons have been remotely located.

In accordance with some embodiments, the partially masked inner LED 426 illuminates first predetermined artwork 442, 444 of the masked artwork 404 for non gloved mode operation of the electronic device, and the outer LED 428 illuminates second predetermined artwork 452, 454 of the masked artwork 404 for a gloved mode operation of the electronic device. The masked artwork 404 is automatically illuminated by the inner LED 426 for non-gloved mode operation, and the masked artwork 404 is automatically switched and illuminated for gloved mode operation in response to a gloved input to the translucent housing 404.

Figure 4D:
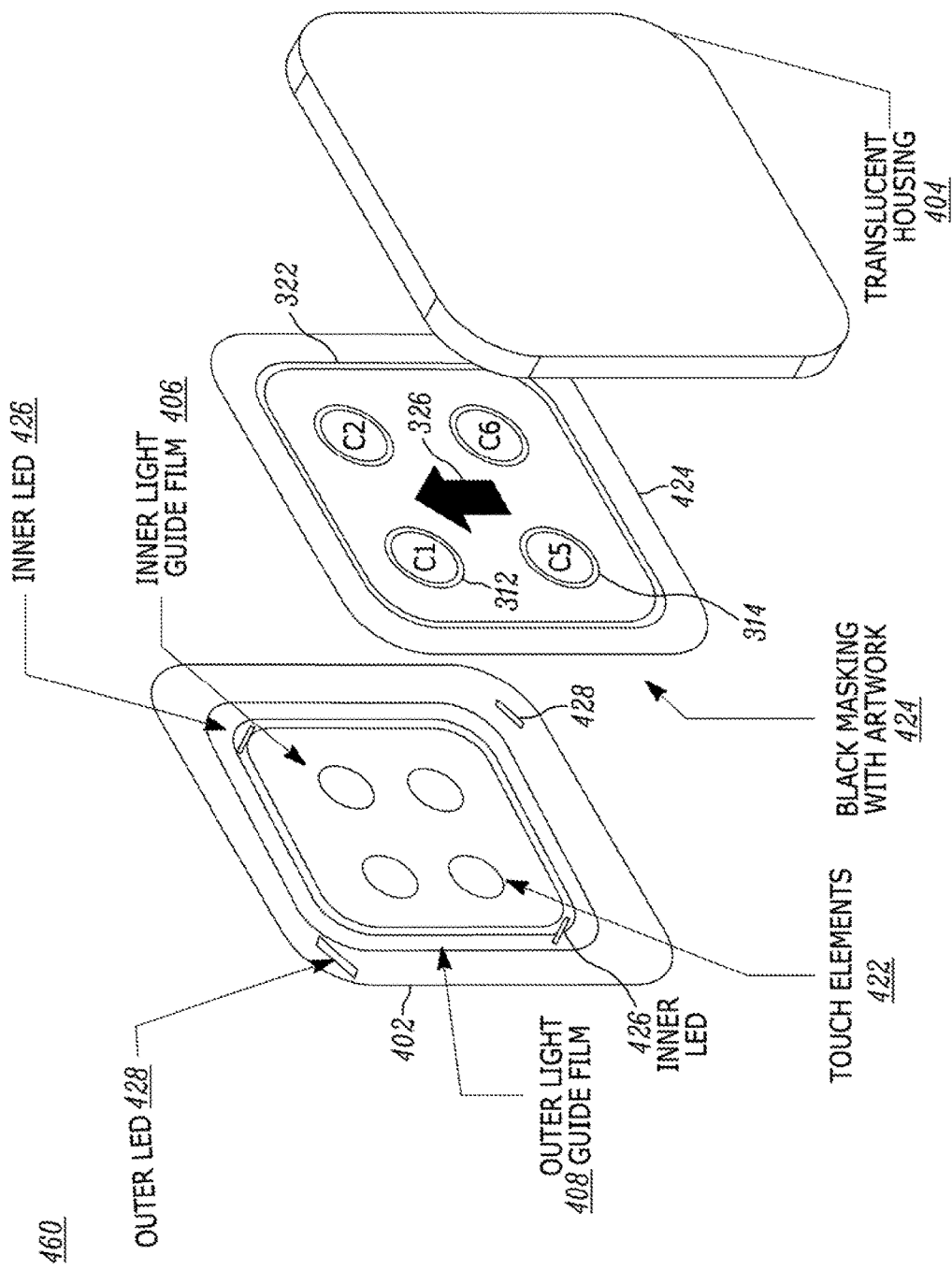
FIG. 4D is an exploded view of the touch sensitive display assembly for an electronic device in accordance with some embodiments.

FIG. 4D is an exploded view 460 of the touch screen sensitive button assembly for an electronic device in accordance with some embodiments. Exploded view 460 shows translucent housing 404, masked artwork 424, and touch button system 480 formed in accordance with the touch button embodiment. In accordance with the touch element button embodiment, the printed circuit board (pcb) 402 is shown having a plurality of touch sensitive elements 422 disposed thereon. In this case there are four touch sensitive elements 422, one for each button C1, C2, C5, and C6 (representing four buttons), such as were shown back in FIG. 3. These four touch sensitive capacitive elements sense touch non-gloved touch through input to the translucent housing 404. When the input to the translucent housing 404 does not meet a preset capacitance touch level associated with non-gloved mode, the touch sensitive capacitive elements 422 operated as a singled combined button having a different graphic illuminated and bounded by boundary 322.

It is notable that the arrow symbol 326 does not have a single corresponding touch sensitive element, as the arrow symbol in accordance with the embodiments, is provided as a single larger button formed through the combination of the four touch sensitive elements 422 in gloved mode operation. The inner LEDs 426 illuminate across the inner light guide film 406 and up through the outer light guide film 408 during non gloved-mode operation. The outer LEDs 428 illuminate only through the outer light guide film 408 and masked artwork during gloved operation. In this example the masked artwork 424 provides for illuminated border 452 outlining a boundary 322 for a functional arrow 326. The arrow 326 represents an electronic control function of the electronic device.

Figure 5A:
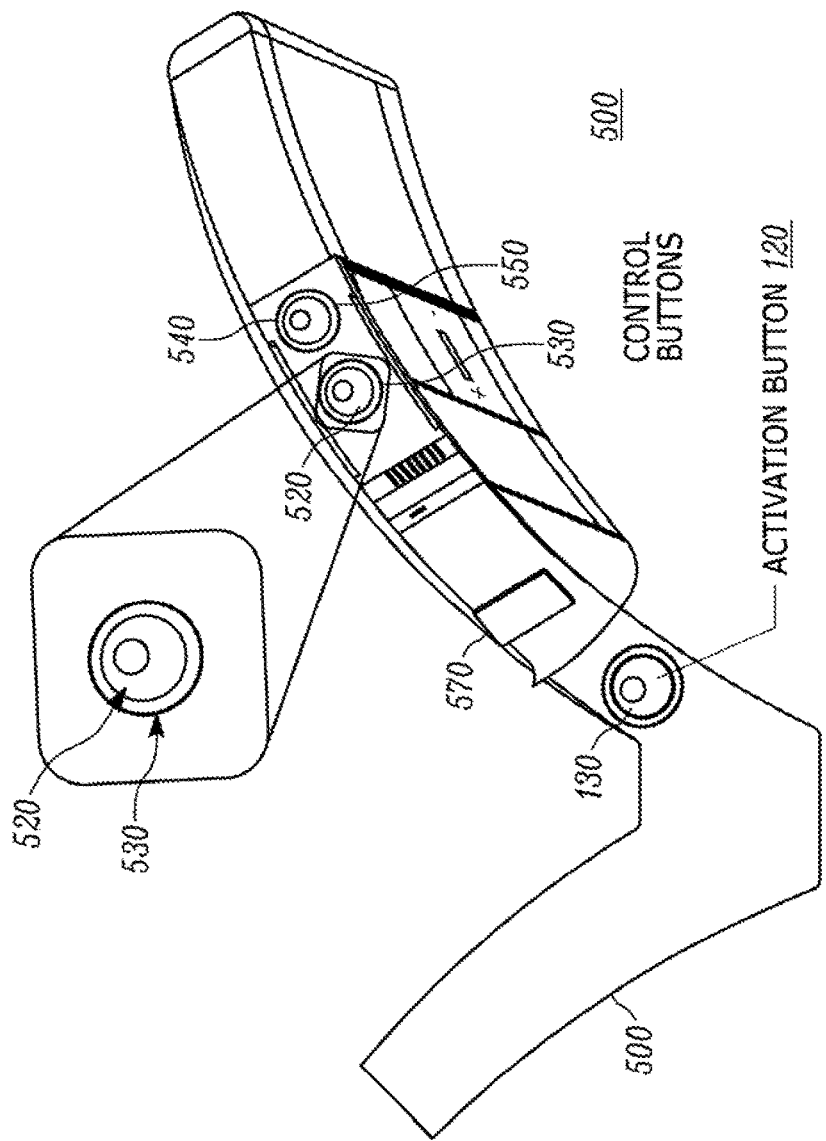
FIG. 5A is a user interface incorporating a dual control button integrated as part of a body wearable harness formed and operating in accordance with some of the embodiments.

FIG. 5A is a user interface 500 integrated as part of a body wearable harness 504 formed and operating in accordance with some of the embodiments. Harness 504 incorporates a dual button user interface formed and operating in accordance with the gloved mode embodiments for improved touch sensitivity and further comprises haptic feedback 570 for improved button identification in accordance with some embodiments. Harness 504 comprises a first control button 520 and a second touch sensitive control button 540, each surrounded by a respective touch element 530 and 550. The first control button 520 is surrounded by touch element 530, and the second touch sensitive control button 540 is surrounded by touch element 550. The dual control buttons 520, 540 may control for example, remote programming functions for radio 180. In accordance with some embodiments, the dual control buttons 520, 540 are embodied as mechanical control buttons, formed of popples surrounded by the respective touch elements 530, 540.

In accordance with the various embodiments, the user interface system 500 of harness 504 provides the single activation button 120 for establishing gloved mode operation. In accordance with the various embodiments, the first capacitive touch sensitive element 130 surrounds the activation button 120, the first capacitive touch element determining or establishing the mode of operation as being a gloved mode of operation, as opposed to a non-gloved mode of operation based on the button press to button 120 and a measurement of capacitance as previously described. The sensitivity levels of the control buttons 520, 540 respective touch elements 530, 550, are automatically set to a high capacitance level in response a determination of gloved usage. The high capacitance levels which are set to control touch element 530, 550 can be set to the capacitive measurement level taken during the determination of gloved mode operation at the activation button 120.

For the non-gloved mode of the all-mechanical button embodiment, touch sensing need not be used and as such the touch elements 530, 550 of control buttons 520, 540 are not set to sense any level and are not functioning. Only the mechanical control buttons 520, 540 operate to control the radio functions in this non-gloved mode embodiment.

Harness 504 further comprises a haptic signal generator 570 integrated therein and coupled to controller 190 for providing a haptic feedback signal, in the form of vibration alerts, in response to a user's gloved finger approaching one of the buttons 520 or 540. The haptic signal generator 570 generates a unique vibrating signal in response to a gloved finger hovering within a predetermined range one of the plurality of control buttons 520 or 540. Haptic alerts are preferably added in addition to the high sensitivity levels, though not required.

In accordance with the haptic embodiment, once gloved mode is established, the haptic signal provides a vibration alert which allows a user to differentiate between buttons. The vibration alerts are particularly useful in environments where the buttons are or have become difficult to see, such as smoky or dark environments encountered by public safety personnel.

Figure 5B:
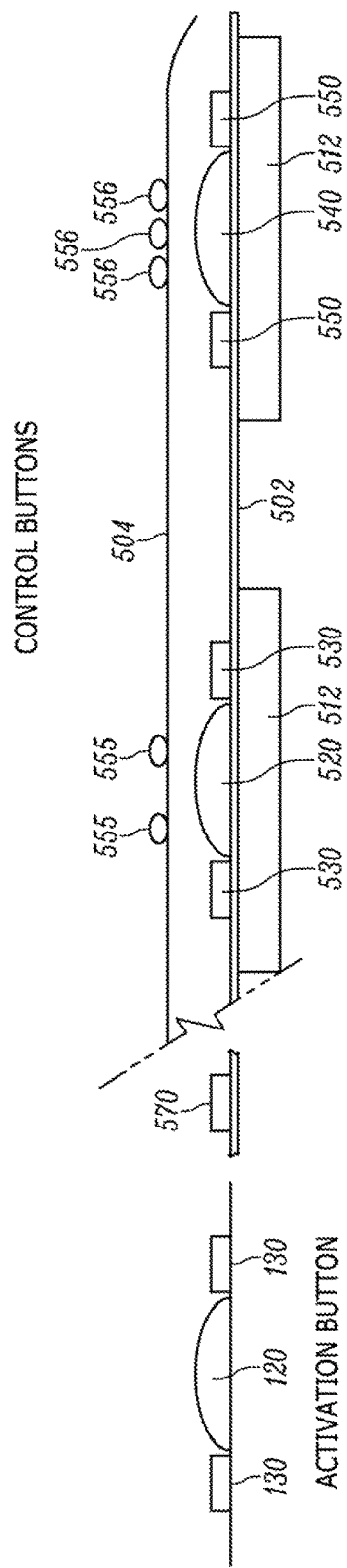
FIG. 5B is a partial cross-sectional view of the user interface showing the activation button of the various embodiments and the dual control button implemented with mechanical components, a haptic signal generator, and raised marking identifiers in accordance with some embodiments.

FIG. 5B is a partial cross-sectional view of the dual control button user interface comprising mechanical markers 555, 556 providing additional button identification in gloved mode operation in accordance with some embodiments. Markers 555, 556 may comprise raised nubs, indentations or branding embedded, added, or stitched to the harness 504, such as integrated within the fabric or material, to provide further identification, alignment and differentiation for proper button activation of button 520 or 540.

It will be appreciated that such raised or embedded identifier markings apply to embodiments where fabric of the harness or some type of housing cover the control buttons. In embodiments where, for example only touch screen button elements are used, such as those described and show in FIG. 3Aa-3D, the masked artwork needs to remain visibly illuminated and as such any raised or indented markings should remain exterior to the border.

Referring back to FIG. 5B, this view shows cross sections of the two programmable control buttons 520, 540 and respective corresponding touch elements 530, 550 disposed on a substrate, such as a flexible printed circuit (FPC) board 502. Stiffeners 512 may be used on the FPC 502 beneath each button for improved tactile feedback, if desired. The haptic element 570 is disposed on the FPC board 502 and is electrically coupled to the touch sensitive elements 520 and 540. In accordance with the various embodiments, detection of a gloved finger input to activation button 120 can result in high levels of sensitivity at elements 530, 550.

Figure 5C:
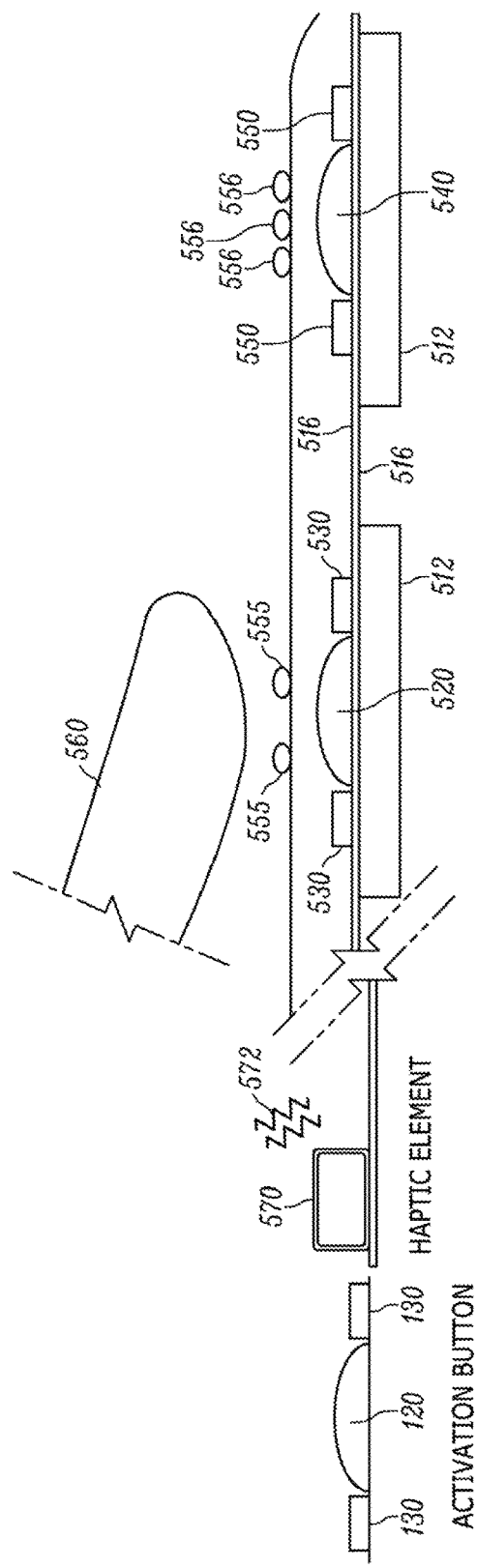
FIG. 5C is a partial cross-sectional view of the dual button showing improved sensitive actuation, haptic vibration, and differentiated indentations in accordance with some embodiments.

FIG. 5C is a partial cross-sectional view featuring gloved mode operation of the dual control button 520, 540 with increased sensitivity actuation, haptic vibration, and differentiated indentations in accordance with some embodiments. In FIG. 5C, gloved-mode operation has already been established. In operation, as gloved finger 560 begins to navigate between buttons of the harness 500, the haptic feedback element 670 generates a haptic feedback signal 572, such as vibration signal, providing an alert to the gloved user as to which button is being approached. For example, two short pulsed vibrations 572 could indicate control button 520 while three longer vibration alerts could indicate control button 540 is being approached. By simply approaching the control button 520 or 540, a haptic signal will be generated indicating identity of the closest button. The vibration alert can increase frequency as the gloved finger approaches the correct button.

Accordingly, for the all mechanical button embodiment, touch elements 530 and 550 will be automatically turned on for hovering purposes in gloved mode with high sensitivity levels, set the same for activation of the control buttons. No touch sensing is required for the non-gloved mode.

Additionally, the mechanical indentations 555, 556 provide a further identification, alignment and differentiation for proper button activation during gloved-mode operation. These indentations can be felt through gloves, and further trigger haptic feedback from haptic element 570. When the user is satisfied that the correct button has been located the button can be activated by pressing the button. For embodiments using capacitive touch display or touch screen type buttons, no physical indentations would be used as the artwork should remain visible.

In accordance with the haptic embodiment, once gloved mode is established the haptic signal provides a way for a user to differentiation between buttons via a vibrations alert, which is particularly useful in environments where the buttons are or have become difficult to see.

Figure 6:
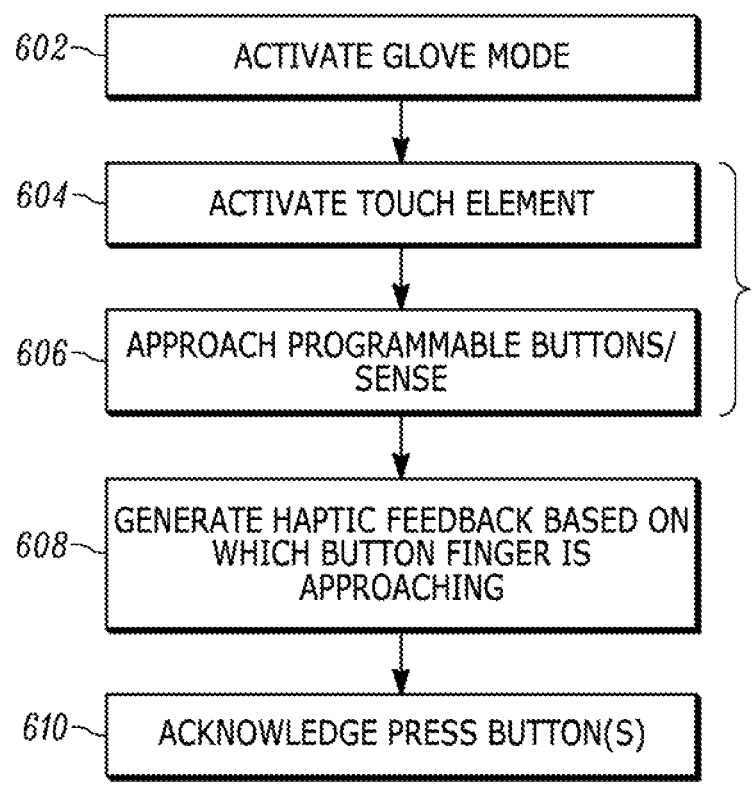
FIG. 6 is a method for additional button identification during gloved-mode operation in accordance with some embodiments.

FIG. 6 is a method 600 for expanded button contact actuation of a button during gloved mode operation in accordance with some embodiments. Method 600 summarizes the steps by activating gloved mode operation at 602, such as by pressing a button with a gloved finger a taking a capacitance measurement, as was described in the method of FIG. 2. Once gloved mode is established at 602, a touch element is activated at 604 by approaching one of the buttons, such as first button 520 having touch element 530, or second touch sensitive control button 540 having touch element 550 of FIG. 5, with a gloved finger at 606. A haptic feedback signal is generated based on which button the gloved finger is approaching at 608. This determination may be made by a controller of the electronic device monitoring the capacitance of the first and second touch elements 540, 550. An acknowledgment in the form of a button press is made at 610 once the desired button is located.

The addition of haptic feedback summarized in method 600 can be incorporated into mechanical control button embodiments and regular touch capacitive control button embodiments. Furthermore, the addition to haptic feedback to an embodiment of already increased sensing provides a particularly advantageous user interface as the combination of increased sensitivity levels and haptic feedback provide for an enhanced user experience in gloved usage. Even further beneficially, when haptic feedback is incorporated into display/screen type environments where buttons are combined along with increased sensitivity levels the resulting user interface providing remote access to a portable radio minimizes issues associated with past gloved usage such as inability to trigger, and false triggering.

As discussed previously additional collaborative devices such as a smart phone and smart watch can take advantage of activation button and capacitance measurement of the various embodiments to further enable collaboration and gloved control of devices by a single user.

Accordingly, the various embodiments have provided for a user interface formed of a touch control system. The system advantageously provides a primary touch element in the form of an activation button having the capability to automatically detect a gloved or non-gloved finger input. Sensitivity levels of secondary control buttons are automatically set and/or adjusted (increased) in response thereto. Control button identification is further provided by the addition of haptic feedback and hovering.

The various embodiments of interfaces have provided for:
a mechanical touch sensitive activation button with regular touch-type control buttons;
an all-touch screen type embodiment for activation button and all control buttons;
an all-mechanical touch sensitive activation button and control buttons.

The embodiments have provided for an activation button as a mechanical button and remaining control buttons as regular touch-type control buttons, in which establishing gloved mode operation includes establishing sensitivity levels of hover and activate for the control buttons. In the mixed of embodiment, the sensitivity levels automatically adjusted for a hover sensitivity level and a control button enable sensitivity level, based on the gloved activation button sensitivity measurement. Control button identification is provided by hovering and haptic feedback.

The embodiments have further provided for an all-touch sensing element type interface (without any mechanical buttons), in which sensitivity levels automatically adjusted for a hover level and a control activation level, with control button identification being provided by hovering and haptic feedback. For screen type embodiments, the control buttons may be combined into larger but fewer screen buttons within the same space.

The embodiments have further provided for an all mechanical button embodiments, touch elements are be automatically turned on for hovering purposes in gloved mode with high sensitivity levels, set to the same for activation of the control buttons. Thus, vibration alerts facilitate identifying buttons in gloved mode operations. No touch sensing is required for the non-gloved mode of the all-mechanical button embodiments.

The touch interface system provided by the various embodiments is well suited to body wearable devices, such as a harness radio interface for public safety environments where visibility may be limited. The very intuitive user interface facilitates gloved mode operation and the managements of buttons. False triggering on a touch element is greatly minimized and battery life is able to be conserved since the touch sensitivity need not be activated all the time, but only when enabled by a gloved finger input.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A touch button control system, comprising:
   a body wearable harness;
   a flexible printed circuit (FPC) board embedded within the body wearable harness;
   a plurality of user interface buttons disposed on a top surface of the FPC board, one of the plurality of user interface buttons being an activation button; and
   a first capacitive touch sensitive element surrounding the activation button on the top surface of the FPC board, the first capacitive touch sensitive element establishing gloved mode operation and non-gloved mode operation.

2. The touch button control system of claim 1, further comprising:
   a plurality of control buttons operating with an increased level of sensitivity during gloved mode operation.

3. The touch button control system of claim 2, wherein the plurality of control buttons each having individualized vibration identification signal assigned thereto.

4. The touch button control system of claim 2, further comprising:
   a haptic signal generator for generating a unique vibrating signal in response to a gloved finger hovering within a predetermined range one of the plurality of control buttons.

5. The touch button control system of claim 1, wherein the plurality of user interface buttons further comprises:
   a plurality of control buttons; and
   in response to gloved mode operation being established by the activation button, the plurality of control buttons being automatically increased in sensitivity level.

6. The touch button control system of claim 1, wherein the plurality of user interface buttons further comprises:
   a plurality of control buttons; and
   in response to gloved mode operation being established by the activation button, the plurality of control buttons being automatically:
   increased in sensitivity level; and
   provided with hovering haptic feedback.

7. The touch button control system of claim 1, wherein the plurality of user interface buttons further comprises:
   a plurality of control buttons; and
   in response to gloved mode operation being established by the activation button, the plurality of control buttons being automatically:
   increased in sensitivity level; and
   provided with hovering haptic feedback capability; and
   combined into larger but fewer buttons.

8. The touch button control system of claim 1, wherein the plurality of user interface buttons further comprise:
   a plurality of control buttons comprising a plurality of display touch elements formed of discrete graphical user interface control buttons, wherein in gloved mode operation the plurality of display of touch elements combine to form a fewer number of display touch buttons each having an expanded user interface size with an enlarged button area.

9. The touch button control system of claim 8, wherein the fewer number of larger display touch buttons having expanded user interface size have increased sensitivity level.

10. The touch button control system of claim 9, wherein in gloved mode operation, hovering a gloved finger input over the enlarged button area having increased sensitivity level activates a vibration signal.

11. The touch button control system of claim 10, wherein the vibration signal identifies the display control button or a function associated with the display control button.

12. The touch button control system of claim 1, wherein the activation button comprises a mechanical popple dome button having a touch sensitive capacitive pad associated therewith.

13. The touch button control system of claim 1, in response to gloved mode operation being established, a secondary touch element control button is increased in sensitivity level, provided with hovering haptic feedback capability, and/or combined into larger but fewer buttons.

* * * * *